US008050091B2

(12) United States Patent
Park et al.

(10) Patent No.: US 8,050,091 B2
(45) Date of Patent: *Nov. 1, 2011

(54) EEPROM DEVICES AND METHODS OF OPERATING AND FABRICATING THE SAME

(75) Inventors: Geun-sook Park, Suwon-si (KR); Sang-bae Yi, Seoul (KR); Soo-cheol Lee, Seoul (KR); Ho-ik Hwang, Seoul (KR); Tae-jung Lee, Yongin-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 165 days.

This patent is subject to a terminal disclaimer.

(21) Appl. No.: 12/542,787

(22) Filed: Aug. 18, 2009

(65) Prior Publication Data

US 2009/0310427 A1 Dec. 17, 2009

Related U.S. Application Data

(63) Continuation of application No. 11/643,837, filed on Dec. 22, 2006, now Pat. No. 7,593,261.

(30) Foreign Application Priority Data

Dec. 22, 2005 (KR) ........................ 10-2005-0127770

(51) Int. Cl.
*G11C 16/04* (2006.01)
(52) U.S. Cl. ......... 365/185.05; 365/185.18; 365/185.26; 365/185.27
(58) Field of Classification Search ............. 365/185.05, 365/185.18, 185.26, 185.27
See application file for complete search history.

(56) References Cited

U.S. PATENT DOCUMENTS

| 5,587,945 A | 12/1996 | Lin et al. |
| 5,615,150 A | 3/1997 | Lin et al. |
| 5,640,346 A | 6/1997 | Preslar |
| 5,646,901 A | 7/1997 | Sharpe-Geisler et al. |
| 5,969,992 A | 10/1999 | Mehta et al. |
| 6,005,270 A * | 12/1999 | Noguchi ........................ 257/315 |
| 6,326,663 B1 | 12/2001 | Li et al. |
| 6,545,915 B2 * | 4/2003 | Ohtani et al. ............ 365/185.29 |
| 6,784,933 B1 * | 8/2004 | Nakai ............................ 348/302 |
| 7,372,734 B2 * | 5/2008 | Wang ........................ 365/185.14 |
| 7,593,261 B2 * | 9/2009 | Park et al. ................ 365/185.05 |
| 2005/0275009 A1 | 12/2005 | Maemura et al. |

OTHER PUBLICATIONS

Nov. 4, 2008 German Office Action related to to German Patent Application 10 2006 062 381.9-33.
Office Action dated Jun. 5, 2009 from Chinese Patent Office corresponding to Chinese application with English Translation.

* cited by examiner

Primary Examiner — Pho M Luu
(74) Attorney, Agent, or Firm — Volentine & Whitt, PLLC

(57) ABSTRACT

An electrically erasable and programmable read-only memory (EEPROM) is provided. The EEPROM includes a semiconductor substrate including spaced apart first, second and third active regions, a common floating gate traversing over the first through third active regions, source/drain regions formed in the third active region on opposite sides of the floating gate, a first interconnect connected to the first active region, a second interconnect connected to the second active region, and a third interconnect connected to either one of the source/drain regions.

20 Claims, 7 Drawing Sheets

EEPROM DEVICES AND METHODS OF OPERATING AND FABRICATING THE SAME

CROSS-REFERENCE TO RELATED APPLICATIONS

This is a Continuation of U.S. non-provisional patent application Ser. No. 11/643,837, filed Dec. 22, 2006, and issued as U.S. Pat. No. 7,593,261, the disclosure of which is incorporated herein by reference in its entirety.

BACKGROUND OF THE INVENTION

1. Field of the Invention

The present invention generally relates to a semiconductor memory device and, more particularly, to an Electrically Erasable Programmable Read-Only Memory (EEPROM) and to methods of operating and fabricating the same.

A claim of priority is made to Korean Patent Application No. 10-2005-0127770, filed on Dec. 22, 2005, in the Korean Intellectual Property Office, the disclosure of which is incorporated herein in its entirety by reference.

2. Description of the Related Art

Semiconductor memory devices are generally classified as either volatile memory devices which lose stored data when the supply of power is interrupted, or non-volatile memory devices which retain stored data even when the supply of power is interrupted. Electrically erasable and programmable read-only memories (EEPROMs) are one kind of non-volatile memory device.

An EEPROM generally adopts a stacked gate structure within each unit memory cell, where the stacked gate structure includes a floating gate and a control gate formed over the floating gate.

In the meantime, different manufacturing techniques may be used to form a semiconductor device. One such technique includes a System on Chip (SoC). In a SOC, a logic device, a memory device, and other such components of a semiconductor device, are embodied in a single chip. Because all the functions of these components are integrated on a single chip, the size of the device may be reduced significantly. Furthermore, the manufacturing costs of the semiconductor device may also be reduced since all the functionality of these components is present in one chip.

Because the SOC includes a number of devices, it would be preferable if the component devices on the SOC should be fabricated using identical processing techniques. For example, when the SoC includes a logic device and an EEPROM memory device, it would be advantageous if both the logic device and the EEPROM were fabricated using identical processing techniques. However, there may be problems associated with using the same processing techniques for different components on a SOC. This is primarily due to the differing structures of the components on the SOC. For example, a logic device utilizes a transistor having a single gate structure, while an EEPROM utilizes a transistor having a stacked gate structure. These different structures can significantly complicate manufacturing of a SOC.

In an effort to overcome this problem, an EEPROM having a single gate structure has been studied. By adopting an EEPROM with the single gate structure, the SOC can be manufactured using the same CMOS process that is also used to fabricate the logic device.

FIGS. 1A and 1B illustrate a conventional technique for data writing and data erasing of an EEPROM having a single gate structure. Referring to FIG. 1A, a P-type semiconductor substrate 100 is provided. Furthermore, N-type source/drain regions 117 and an N-well contact region (115) are formed in the semiconductor substrate 100. In addition, an N-well 110 is formed in the semiconductor substrate 100. Furthermore, P-type source/drain regions 113 are formed in the N-well 110. Finally, an N-gate 127 and a P-gate 123 are formed on the semiconductor substrate 100. In the EEPROM shown in FIG. 1A, the N-gate 127 and the P-gate 123 are portions of a single floating gate.

Data is written on the EEPROM device as follows. First, a programming voltage Vp that is a positively high voltage is applied to the P-type source/drain regions 113 and the N-well contact region 115. By doing so, the programming voltage Vp is supplied to the N-well 110, and is then capacitively coupled to the P-gate 123, i.e., the floating gate. Furthermore, the N-type source/drain regions 117 and the semiconductor substrate 100 are grounded. Accordingly, a high electric field is formed between the N-gate 127 and the semiconductor substrate 100. Therefore, electrons of the semiconductor substrate 100 are subjected to Fowler-Nordheim (F-N) tunneling to the N gate 127, i.e., the floating gate, and are stored in the floating gate.

Referring to FIG. 1B, the erasing of the data from the EEPROM will now be described. An N-well contact region 115 and the P-type source/drain regions 113 are grounded. By doing so, a ground voltage is supplied to the N-well 110, and is then capacitively coupled to the P-gate 123, i.e., the floating gate. In addition, an erasing voltage Ve that is a positively high voltage is applied to the N-type source/drain regions 117. Furthermore, the semiconductor substrate 100 is grounded. As a result, a high electric field is formed between the N-type source/drain regions 117 and the N-gate 127. Therefore, the electrons of the N-gate 127, i.e., the floating gate, are subjected to F-N tunneling to the N-type source/drain regions 117. This F-N tunneling erases the charges stored in the floating gate.

While the above-mentioned techniques may be used to program data to and erase data from an EEPROM having a single gate structure, these techniques have several shortcomings. For example, the high voltage applied to the N-type source/drain regions 117 during the erasing of the data may break down a junction between the N-type source/drain regions 117 and the semiconductor substrate 100. This problem is especially acute when the EEPROM having the single gate structure is formed by CMOS processing, i.e., the junction breakdown voltage between the N-type source/drain regions 117 and the semiconductor substrate 100 may be as low as 10V or less.

SUMMARY OF THE INVENTION

According to an aspect of the present invention, an electrically erasable and programmable read-only memory (EEPROM) is provided. The EEPROM includes a semiconductor substrate including spaced apart first, second and third active regions, a common floating gate traversing over the first through third active regions, source/drain regions formed in the third active region on opposite sides of the floating gate, a first interconnect connected to the first active region, a second interconnect connected to the second active region, and a third interconnect connected to either one of the source/drain regions.

According to another aspect of the present invention, an electrically erasable and programmable read-only memory (EEPROM) is provided. The EEPROM includes a semiconductor substrate of a first conductivity type, a read active region, a control active region, and an erase active region spaced apart from one another in the semiconductor substrate, a control well of a second conductivity type disposed within the semiconductor substrate of the control active region, an erase well of the second conductivity type disposed within the semiconductor substrate of the erase active region, a common floating gate traversing over the read active region, the control active region, and the erase active region, source/drain regions of the second conductivity type formed in the read active region on opposite sides of the floating gate, control impurity regions of the first conductivity type formed in the control active region on opposite sides of the floating gate, erase impurity regions of the first conductivity type formed in the erase active region on opposite sides of the floating gate, a word line commonly connected to the control well and the control impurity regions, and an erase line commonly connected to the erase well and the erase impurity regions.

According to yet another aspect of the present invention, an electrically erasable and programmable read-only memory (EEPROM) is provided. The EEPROM includes a read transistor including a drain region connected to a bit line, a source region connected to a source line, and a floating gate, a control MOS capacitor having a first electrode commonly sharing the floating gate, and a second electrode connected to a word line, and an erase MOS capacitor having a first electrode commonly sharing the floating gate, and a second electrode connected to an erase line.

According to still another aspect of the present invention, a method of writing data to an electrically erasable and programmable read-only memory (EEPROM) is provided, where the EEPROM includes a semiconductor substrate including spaced apart first, second and third active, a common floating gate traversing over the first through third active regions, and source/drain regions formed in the third active region on opposite sides of the floating gate. The method includes supplying a programming voltage to the first active region and supplying a ground voltage to the second active region.

According to another aspect of the present invention, a method of erasing data of an electrically erasable and programmable read-only memory (EEPROM) is provided, where the EEPROM includes a semiconductor substrate including spaced apart first, second and third active, a common floating gate traversing over the first through third active regions, and source/drain regions formed in the third active region on opposite sides of the floating gate. The method includes supplying a ground voltage to the first active region, and supplying an erase voltage to the second active region.

According to still another aspect of the present invention, a method of reading out data of an electrically erasable and programmable read-only memory (EEPROM) is provided, where the EEPROM includes a semiconductor substrate including spaced apart first, second and third active, a common floating gate traversing over the first through third active regions, and source/drain regions formed in the third active region on opposite sides of the floating gate. The method includes supplying a read voltage to the first active region, supplying a power supply voltage to the drain region, and supplying a ground voltage to the source region.

According to yet another aspect of the present invention, a method of operating an electrically erasable and programmable read-only memory (EEPROM) is provided, where the EEPROM includes a semiconductor substrate including spaced apart first, second and third active, a common floating gate traversing over the first through third active regions, and source/drain regions formed in the third active region on opposite sides of the floating gate. The method includes supplying a programming voltage to the first active region, and supplying a ground voltage to the second active region to write data, supplying a read voltage to the first active region, supplying a power supply voltage to the drain region, and supplying the ground voltage to the source region to read out the written data, and supplying the ground voltage to the first active region, and supplying an erase voltage to the second active region to erase the written data.

According to another aspect of the present invention, a method of writing data to an electrically erasable and programmable read-only memory (EEPROM) is provided, where the EEPROM includes a read transistor including a drain region connected to a bit line, a source region connected to a source line, and a floating gate, a control MOS capacitor having a first electrode commonly sharing the floating gate, and a second electrode connected to a word line, and an erase MOS capacitor having a first electrode commonly sharing the floating gate, and a second electrode connected to an erase line. The method includes supplying a programming voltage to the word line and supplying a ground voltage to the erase line.

According to still another aspect of the present invention, a method of erasing data of an electrically erasable and programmable read-only memory (EEPROM) is provided, where the EEPROM includes a read transistor including a drain region connected to a bit line, a source region connected to a source line, and a floating gate, a control MOS capacitor including a first electrode commonly sharing the floating gate, and a second electrode connected to a word line, and an erase MOS capacitor including a first electrode commonly sharing the floating gate, and a second electrode connected to an erase line. The method includes supplying a ground voltage to the word line and supplying an erase voltage to the erase line.

According to another aspect of the present invention, a method of fabricating an electrically erasable and programmable read-only memory (EEPROM) is provided. The method includes forming device isolating layers within a semiconductor substrate to define a first active region, a second active region and a third active region which are spaced apart from one another, forming a common floating gate traversing over the first through third active regions, forming source/drain regions in the third active region on opposite sides of the floating gate, forming a first interconnect connected to the first active region, forming a second interconnect connected to the second active region, and forming a third interconnect connected to one of the source/drain regions.

BRIEF DESCRIPTION OF THE DRAWINGS

The above and other features the present invention will become readily apparent from the detailed description that follows, with reference to the accompanying drawings, in which.

DETAILED DESCRIPTION OF EMBODIMENTS

Figure 1A:
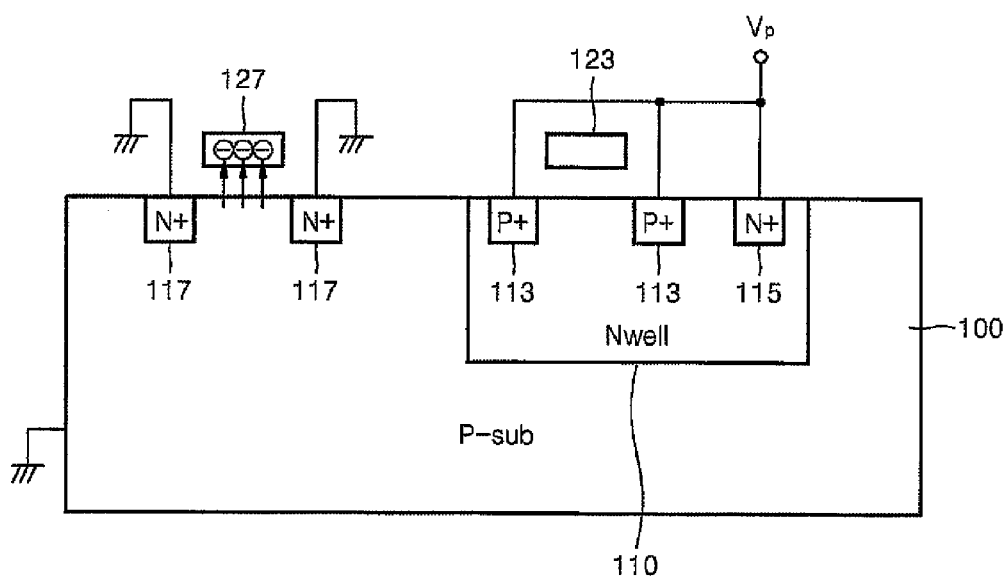
FIGS. 1A and 1B illustrate data writing and erasing of an EEPROM having a single gate structure according to a conventional technique.
Figure 1B:
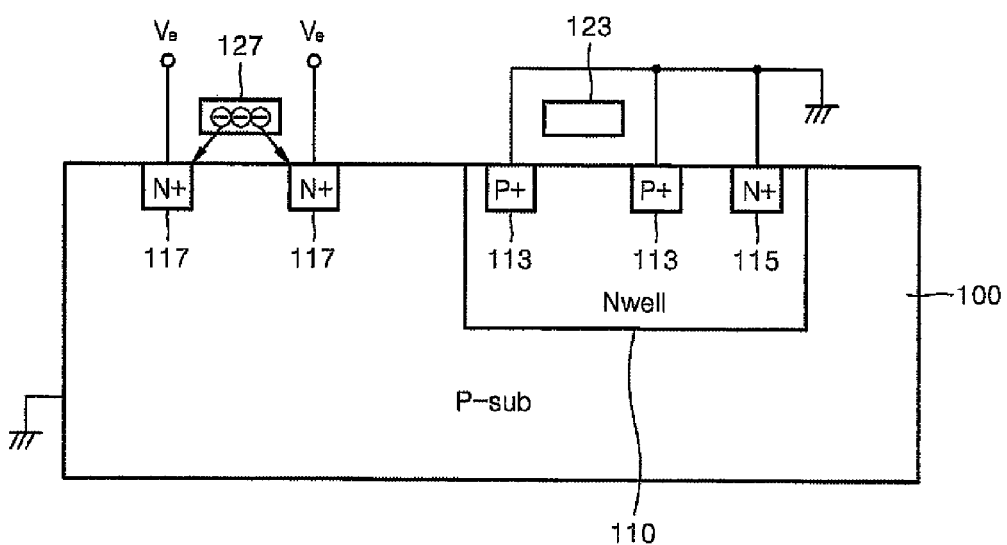
Figure 2:
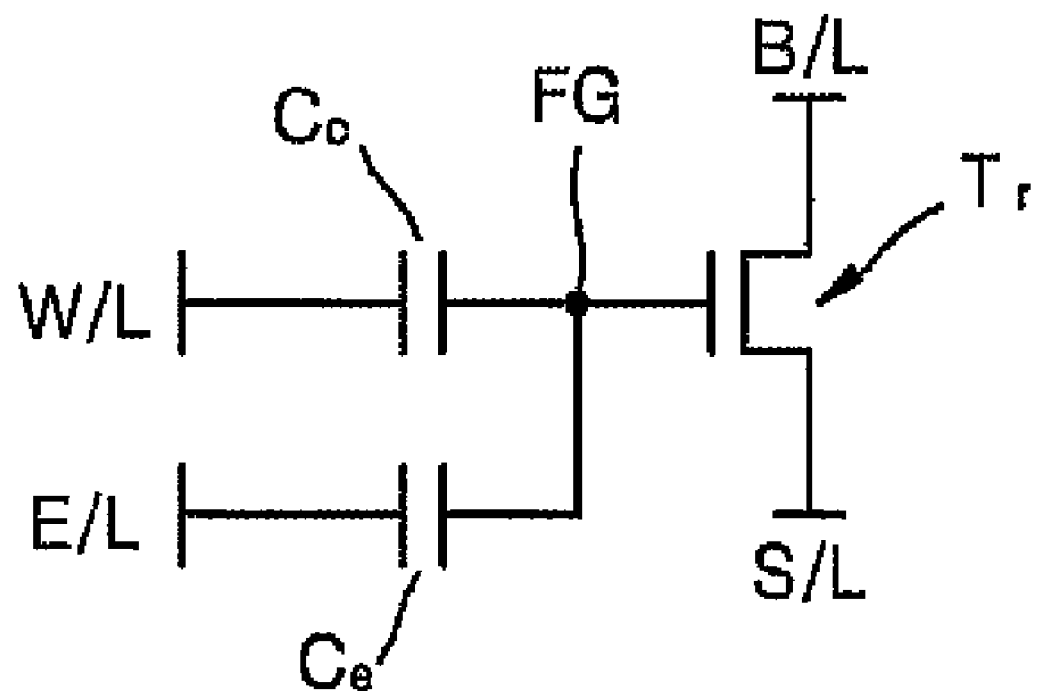
FIG. 2 is an equivalent circuit diagram illustrating a unit cell of an EEPROM according to an exemplary disclosed embodiment of the present invention.

Aspects and features of the present invention will now be described by way of preferred, but non-limiting, embodiments of the invention. FIG. 2 is an equivalent circuit diagram illustrating a unit cell of an EEPROM according to an exemplary disclosed embodiment.

Referring to FIG. 2, a unit cell of an EEPROM includes a read transistor Tr, a control MOS capacitor Cc, and an erasing MOS capacitor Ce. A drain region of the read transistor Tr is connected to a bit line B/L. Furthermore, a source region of the read transistor Tr is connected to a source line S/L. Also, a gate of the read transistor Tr is connected to one electrode of the control MOS capacitor Cc and one electrode of the erasing MOS capacitor Ce. Specifically, the gate of the read transistor Tr, one electrode of the control MOS capacitor Cc, and one electrode of the erase MOS capacitor Ce commonly share a single floating gate FG. In addition, the other electrode of the control MOS capacitor Cc is connected to a word line W/L, and the other electrode of the erase MOS capacitor Ce is connected to an erasing line E/L.

Figure 3:
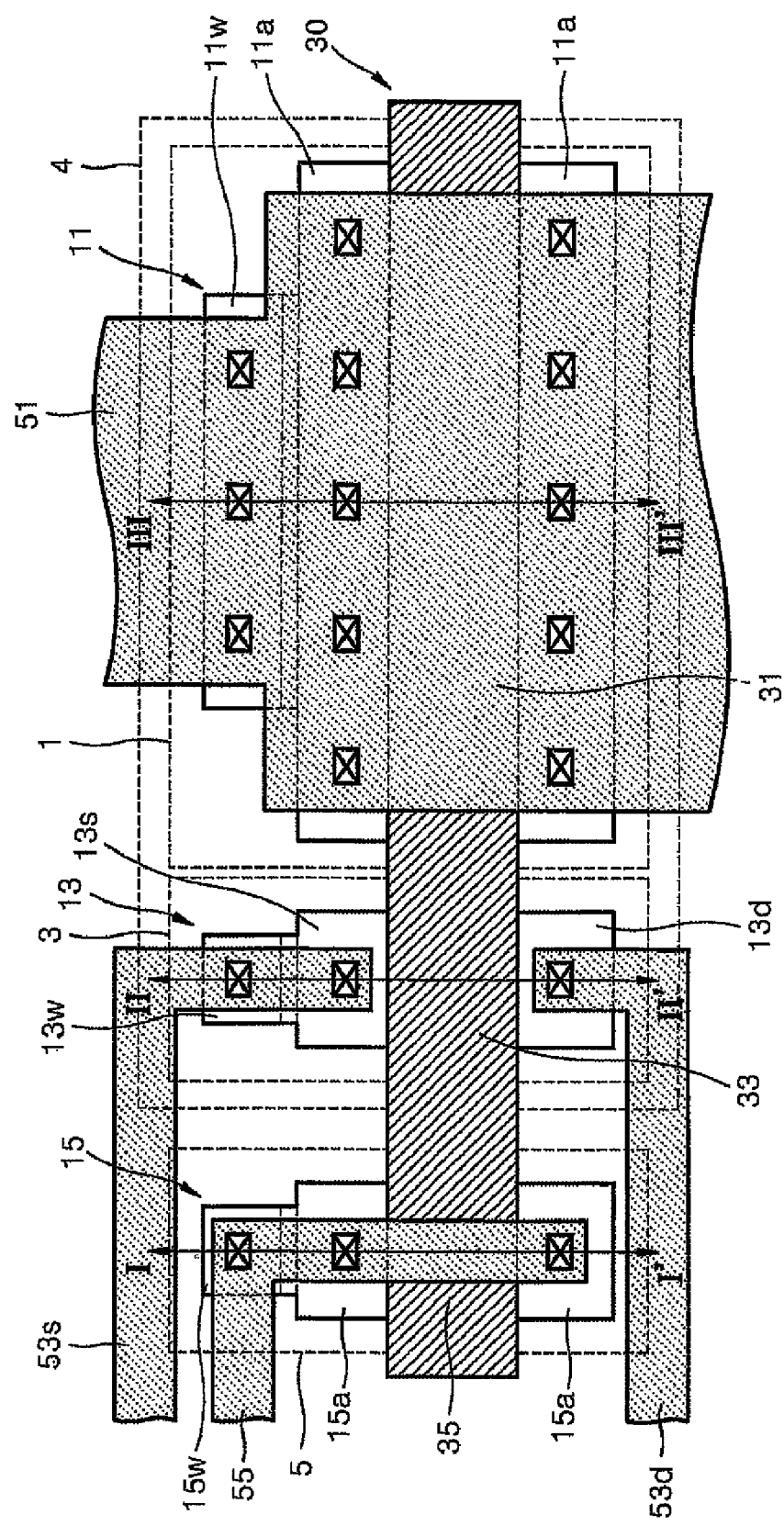
FIG. 3 is a layout illustrating the unit cell of the EEPROM according to an exemplary disclosed embodiment of the present invention.
Figure 4:
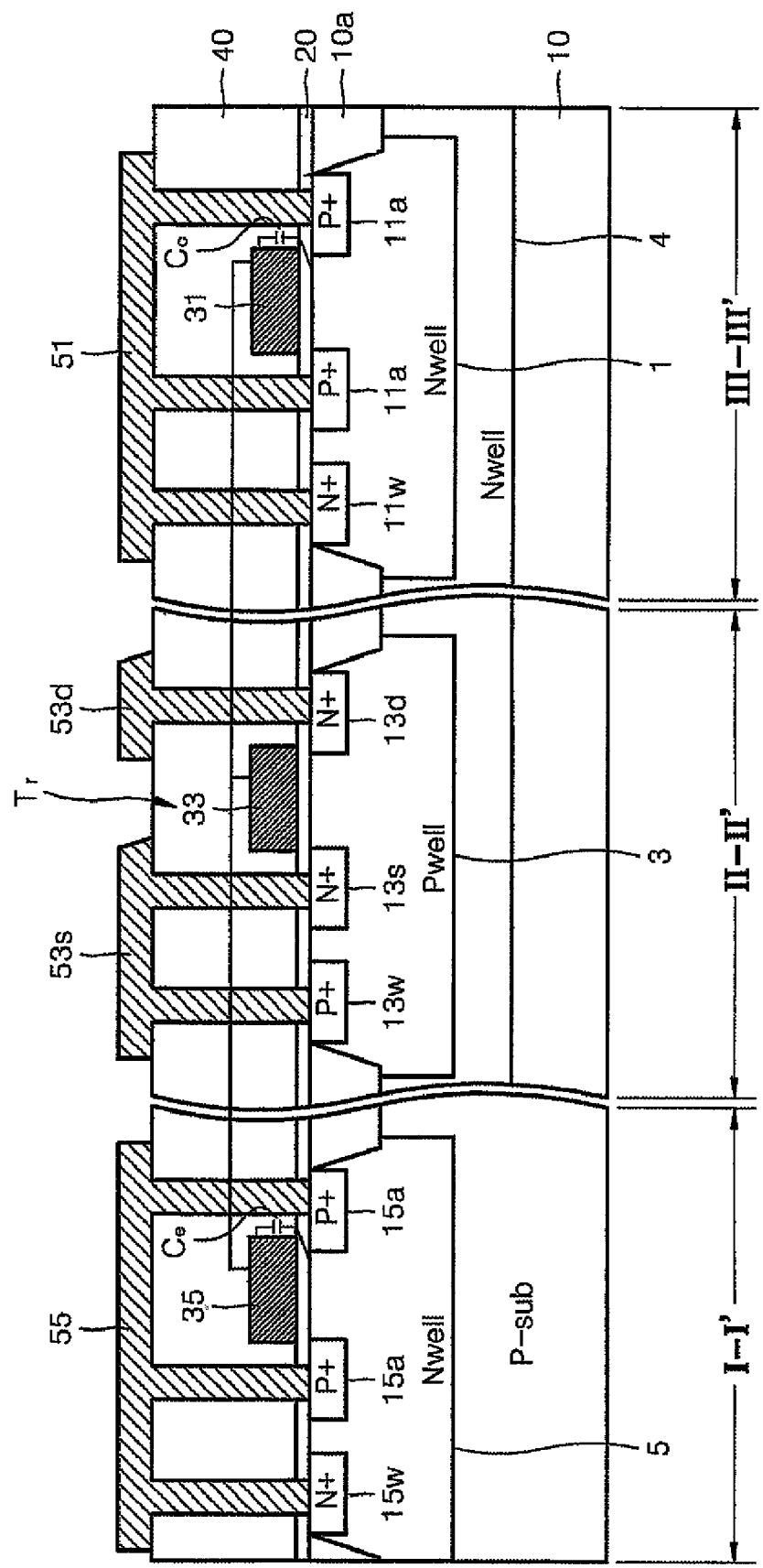
FIG. 4 is a sectional view illustrating sections taken along lines I-I', II-II' and III-III' of FIG. 3.

FIG. 3 is a layout illustrating a unit cell of the EEPROM according an exemplary disclosed embodiment, and FIG. 4 is a sectional view showing portions taken along lines I-I', II-II' and III-III' of FIG. 3.

Referring to FIGS. 3 and 4, a semiconductor substrate 10 includes a first active region, a second active region and a third active region separated and defined by device isolating regions 10a. The first active region may be a control active region 11, the second active region may be an erase active region 15, and the third active region may be a read active region 13. The active regions may be located in an order of the erase active region 15, the read active region 13, and the control active region 11, which are not restricted thereto.

The unit cell also includes a common floating gate 30. In particular, the common floating gate 30 traverses over the active regions 11, 13, and 15, and is disposed on the active regions 11, 13 and 15. In an exemplary embodiment, the floating gate 30 may have a linear form. By doing so, an area of a unit cell can be decreased. Furthermore, the floating gate 30 may be an N-type gate and, more specifically, a polysilicon layer doped with an N-type impurity.

The floating gate 30 includes a control gate part 31, a read gate part 33, and an erase gate part 35. In particular, the control gate part 31 overlaps with the control active region 11. The read gate part 33 overlaps with the read active region 13. Similarly, the erase gate part 35 overlaps with the erase active region 15. An area where the floating gate 30 is overlapped with the control active region 11 may be larger than the areas where the floating gate 30 is overlapped with the erase active region 15 and the read active region 13. By doing so, capacitive coupling between the control active region 11 and the floating gate 30 can be easily achieved.

A first well, i.e., a control well 1, is formed within the semiconductor substrate 10 of the control active region 11. Furthermore, a pair of first impurity regions, i.e., a pair of control impurity regions 11a, is provided in the control active region 11 on opposite sides of the floating gate 30, i.e., the control gate part 31. The control impurity regions 11a have a conductivity type opposite to that of the control well 1. Also, a control well contact region 11w spaced apart from the floating gate 30 and adjacent to either one of the control impurity regions 11a is provided into the control active region 11. The control well contact region 11w has a conductivity type identical to that of the control well 1. Furthermore, the control well contact region has a high impurity density. While the disclosed embodiment includes control impurity regions, the control impurity regions may not be formed in other exemplary embodiments, A second well, i.e., an erase well 5, is formed within the semiconductor substrate 10 of the erase active region 15. Moreover, a pair of second impurity regions, i.e. a pair of erase impurity regions 15a, is provided into the erase active region 15 on opposite sides of the floating gate 30, i.e., the erase gate part 35. The erase impurity regions 15a has a conductivity type opposite to that of the erase well 5. Also, an erase well contact region 15w spaced apart from the floating gate 30 and adjacent to either one of the erase impurity regions 15a is provided into the erase active region 15. The erase well contact region 15w has a conductivity type identical to that of the erase well 5. Furthermore, the erase well contact region has a high impurity density. While the disclosed embodiment includes erase impurity regions, the erase impurity regions may not be formed in other exemplary embodiments.

The control well 1 and the erase well 5 may have the same conductivity type. Particularly, when the semiconductor substrate 10 has a first conductivity type, i.e., the P-type substrate, the control well 1 and the erase well 5 has a second conductivity type, i.e., N-wells having N-type conductivity. In this case, the control impurity regions 11a and the erase impurity regions 15a are P-type impurity regions.

A third well, i.e., a read well 3, is disposed within the semiconductor substrate 10 of the read active region 13. Also, a source region 13s and a drain region 13d that have a conductivity type opposite to that of the read well 3 are provided into the read active region 13 on opposite sides of the floating gate 30, i.e., the read gate part 33. By doing so, the read well 3 encircles the source/drain regions 13s and 13d. Additionally, a read well contact region 13w spaced apart from the floating gate 30 and adjacent to the source region 13s is provided into the read active region 13. The read well contact region 13w has a conductivity type identical to that of the read well 3. Furthermore, the read well contact region 13w has a high impurity density.

The EEPROM unit cell may also include a fourth well. Specifically, a fourth well, i.e., a deep well 4, encircling the read well 3 and having a conductivity type opposite to that of the read well 3 is provided within the semiconductor substrate 10 of the read active region 13. The read well 3 and the deep well 4 may prevent the source/drain regions 13s and 13d from being affected by back bias that may be applied to the semiconductor substrate 10. In addition, the deep well 4 may extend to encircle the control well 1. More specifically, when the semiconductor substrate 10 is a P-type substrate, the read well 3 may be a P-well, and the deep well 4 may be a deep N-well. In this case, the source/drain regions 13s and 13d are the N-type impurity regions. It should be noted that the read well 3 and the deep well 4 may not be formed in other exemplary embodiments.

The EEPROM unit cell may also include a gate insulating layer 20. In an exemplary embodiment, the gate insulating layer 20 is interposed between the floating gate 30 and the respective active regions 11, 13 and 15. The gate insulating layer 20 may have a thickness of about 150 Å.

A control portion of the floating gate 30, i.e., the control gate part 31, the control active region 11, and the interposed gate insulating layer 20 constitute a control MOS capacitor Cc. Thus, one electrode of the control MOS capacitor Cc is the control gate part 31 and the other electrode thereof is the control active region 11. Similarly, an erase portion of the floating gate 30, i.e., the erase gate part 35, the erase active region 15, and the interposed gate insulating layer 20 constitute an erase MOS capacitor Ce. Thus, one electrode of the erase MOS capacitor Ce is the erase gate part 35 and the other electrode thereof is the erase active region 15.

As described above, the control active region 11 includes the control impurity regions 11a on opposite sides of the control gate part 31 and the control well 1 under the control gate part 31. Similarly, as described above, the erase active region 15 includes the erase impurity regions 15a on opposite sides of the erase gate part 35, and the erase well 5 under the erase gate part 35. Furthermore, as also mentioned above, the EEPROM unit memory cell includes a read transistor Tr. In an exemplary embodiment, the read gate part 33, the source/drain regions 13s and 13d, and the gate insulating layer 20 constitute the read transistor Tr.

The EEPROM unit cell may also include an interlayer insulating layer 40. Specifically, in an exemplary embodiment, the interlayer insulating layer 40 covering the floating gate 30 and the active regions 11, 13, and 15, may be disposed on the floating gate 30 and the active regions 11, 13, and 15.

The EEPROM unit cell may also include one or more interconnects that may connect to the active region of the unit cell. For example, a first interconnect 51, a second interconnect 55, a third interconnect 53d, and a fourth interconnect 53s spaced apart from one another, may be disposed on the interlayer insulating layer 40. Specifically, the first interconnect 51 penetrates through the interlayer insulating layer 40 to be connected to the control active region 11. In more detail, the first interconnect 51 is commonly connected to the control well 1, i.e., the control well contact region 11w, and the control impurity regions 11a. Similarly, the second interconnect 55 penetrates through the interlayer insulating layer 40 to be connected to the erase active region 15. In more detail, the second interconnect 55 is commonly connected to the erase well 5, i.e., the erase well contact region 15w, and the erase impurity regions 15a. Also, the third interconnect 53d penetrates through the interlayer insulating layer 40 to be connected to the drain region 13d. In addition, the fourth interconnect 53s penetrates through the interlayer insulating layer 40 to be commonly connected to the read well contact region 13w and the source region 13s. In an exemplary embodiment, the first interconnect 51 is the word line (W/L of FIG. 2), the second interconnect 55 is the erase line (E/L of FIG. 2), the third interconnect 53d is the bit line (B/L of FIG. 2), and the fourth interconnect is the source line (S/L of FIG. 2).

Hereinafter, a method of manufacturing the EEPROM according to an exemplary disclosed embodiment will be described.

Referring to FIG. 4, the device isolating layers 10a are formed in the semiconductor substrate 10. The device isolating layer 10a may be formed by Shallow Trench Isolation (STI). In addition, other methods of forming device isolation layers may also be used to form device isolation layers 10a. Furthermore, the first active region, the second active region and the third active region are separated and defined by the device isolating layers 10a. In particular, the first active region is the control active region (11 of FIG. 3), the second active region is the erase active region (15 of FIG. 3), and the third active region is the read active region (13 of FIG. 3). In an exemplary embodiment, the semiconductor substrate 10 may be a P-type substrate.

Then, a photoresist pattern (not shown) is formed to partially expose the semiconductor substrate 10 including the control active region (11 of FIG. 3) and also partially expose the semiconductor substrate 10 including the erase active region (15 of FIG. 3). In addition, using the photoresist pattern as a mask, an impurity, e.g., an N-type impurity, is implanted at a low density into the semiconductor substrate 10. Accordingly, the first well, i.e., the control well 1, is formed in the semiconductor substrate 10 of the control active region (11 of FIG. 3). Also, the second well, i.e., the erase well 5, is formed within the semiconductor substrate 10 of the erase active region (15 of FIG. 3). Alternatively, the control well 1 and the erase well 5 may be formed using separately performed photolithography.

Similarly, a photoresist pattern (not shown) is formed to partially expose the semiconductor substrate 10 including the read active region (13 of FIG. 3). Furthermore, using the photoresist pattern as a mask, an impurity such as, for example, a P-type impurity, is implanted at a low density into the semiconductor substrate 10. By doing so, the third well, i.e., the read well 3, is formed within the semiconductor substrate 10 of the read active region (13 of FIG. 3).

Subsequently, a photoresist pattern (not shown) is formed to partially expose the semiconductor substrate 10 including the control active region (11 of FIG. 3) and the read active region (13 of FIG. 3). Then, using the photoresist pattern as a mask, an impurity such as, for example, an N-type impurity, is implanted at a low density to the exposed semiconductor substrate 10 with an energy greater than that used for impurity implantation to form the read well 3 and the control well 1. By doing so, the fourth well, i.e., the deep well 4, is formed in the semiconductor substrate 10 of the control active region (11 of FIG. 3) and the read active region (13 of FIG. 3).

One skilled in the art will appreciate that the order of forming the control well 1, forming the erase well 5, forming the read well 3, and forming the deep well 4 is not limited thereto. Furthermore, the forming of the read well 3 and the forming of the deep well 4 may not be performed in other embodiments.

The gate insulating layer 20 is formed on the semiconductor substrate 10 where the wells 1, 3, 4 and 5 are formed. However, the gate insulating layer 20 may be formed before forming the wells 1, 3, 4 and 5. The gate insulating layer 20 may be a thermal oxide layer or a deposited oxide layer.

A gate conductive layer is stacked on the gate insulating layer 20, and then patterned to form the floating gate 30 traversing over the active regions (11, 13 and 15 of FIG. 3). The floating gate 30 may have a linear form. Also, the floating gate 30 may be an N-type impurity-doped polysilicon layer. In addition, as described above, the floating gate 30 includes the control gate part 31 overlapping with the control active region 11, the read gate part 33 overlapping with the read active region 13, and the erase gate part 35 overlapping with the erase active region 15.

A photoresist pattern (not shown) is formed to expose the control active region (11 of FIG. 3) adjacent to the control gate part 31, the read active region (13 of FIG. 3) spaced apart from the read gate part 33, and the erase active region (15 of FIG. 3) adjacent to the erase gate part 35. Using the photoresist pattern as a mask, an impurity such as, for example, the P-type impurity, at a high density is implanted into the exposed active regions (11, 13 and 15 of FIG. 3). By doing so, the pair of first impurity regions, i.e., the pair of control impurity regions 11a, is formed in the control active region (11 of FIG. 3) on opposite sides of the control gate part 31. Similarly, the pair of second impurity region, i.e., the pair of erase impurity regions 15a, is formed in the erase active region 15 on opposite sides of the erase gate part 35. In addition, the read well contact region 13w spaced apart from the read gate part 33 is formed in a similar manner in the read active region 13. While the disclosed exemplary embodiment suggests forming the impurity regions using one common photolithography process, the control impurity regions 11a, the erase impurity regions 15a, and the read well contact region 13w may be formed by separately performed photolithography in other embodiments.

A similar process may be used to form well contact regions and source and drain regions on the semiconductor substrate of the EEPROM unit cell. For example, a photoresist pattern (not shown) is formed to expose the control active region (11 of FIG. 3) spaced from the control gate part 31 and adjacent to either one of the control impurity regions 11a, the read active region (13 of FIG. 3) adjacent to the read gate part 33, and the erase active region (15 of FIG. 3) spaced apart from the erase gate part 35 and adjacent to either one of the erase impurity regions 15a. Furthermore, using the photoresist pattern as a mask, an impurity, e.g., the N-type impurity, at a high density is implanted into the exposed active regions (11, 13 and 15 of FIG. 3). By doing so, the control well contact region 11w is formed in the control active region 11. Also, the source region 13s and the drain region 13d are formed in the read active region 13 of opposite sides of the read gate part 33, and the erase well contact region 15w is formed in the erase active region 15.

On the other hand, instead of one using one common photolithography process, the control well contact region 11w, the source/drain regions 13s and 13d, and the erase well contact region 15w may be formed by separately performed photolithography in other exemplary embodiments. Subsequently, the interlayer insulating layer 40 is formed to cover the floating gate 30 and the active regions (11, 13 and 15 of FIG. 3).

The EEPROM unit cell may also include contact holes. The contact holes may perform various functions. For example, the contact holes are formed in the interlayer insulating layer 40 to expose the control active region 11 and, more specifically, the control impurity regions 11a and the control well contact region 11w. Similarly, the contact holes may be formed to expose the erase active region 15 and, more specifically, the erase impurity regions 15a and the erase well contact region 15w. In addition, the contact holes may be formed to expose the drain region 13d, the source region 13s, and the read well contact region 13w.

Thereafter, an interconnect conductive layer is stacked on the semiconductor substrate 10 having the contact holes therein. This stacked interconnect conductive layer is patterned to form the first interconnect, the second interconnect, the third interconnect, and the fourth interconnect. Specifically, the first interconnect is the word line 51, the second interconnect is the erase line 55, the third interconnect is the bit line 53d, and the fourth interconnect is the source line 53s. The word line 51 is commonly connected to the control active region (11 of FIG. 3), and more specifically, to the control impurity regions 11a and the control well contact region 11w. The erase line 55 is commonly connected to the erase active region (15 of FIG. 3), and more specifically, to the erase impurity regions 15a and the erase well contact region 15w. Also, the bit line 53d is connected to the drain region 13d, the source line 53s is commonly connected to the source region 13s, and the read well contact region 13w.

Figure 5A:
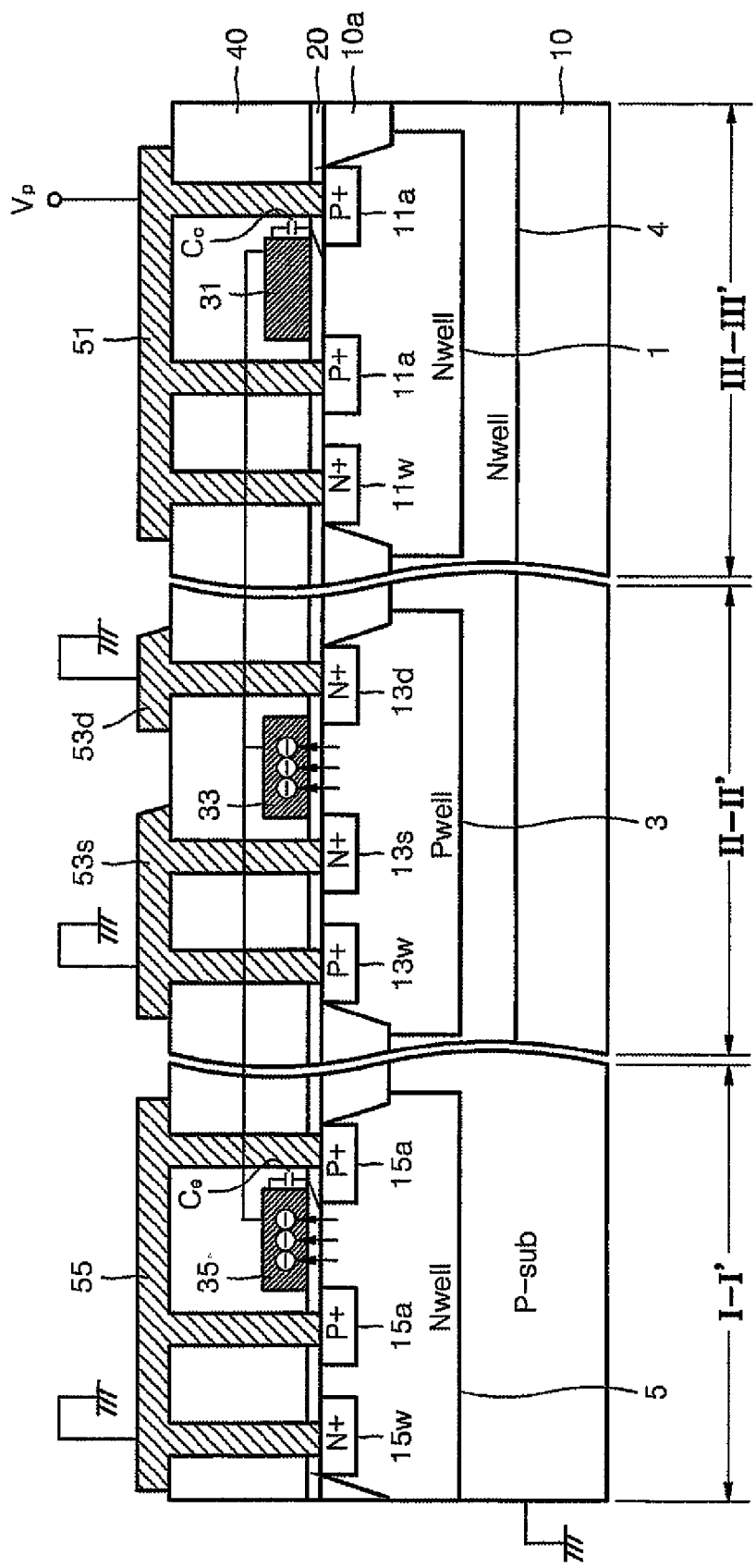
FIG. 5A illustrates writing data to the EEPROM according to an exemplary disclosed embodiment of the present invention.

Hereinafter, a method of operating the EEPROM according to an exemplary disclosed embodiment will be described with reference to FIGS. 5A through 5C. Specifically, referring to FIG. 5A, a method of writing data will now be described. A programming voltage Vp that is a positively high voltage is applied to the control active region (11 of FIG. 3) via the word line 51. Furthermore, a ground voltage is supplied to the erase active region (15 of FIG. 3) via the erase line 55. In addition, the semiconductor substrate 10 is grounded.

In more detail, the programming voltage Vp is applied to the control well 1 via the control well contact region 11w, and to the control impurity regions 11a if the control impurity regions 11a are formed. The ground voltage is supplied to the erase well 5 via the erase well contact region 15w, and to the erase impurity regions 15a if the erase impurity regions 15a are formed. Furthermore, when the deep well 4 is formed to encircle the control well 1, the deep well 4 is also supplied with the programming voltage Vp.

In this case, the area where the floating gate (30 of FIG. 3), i.e., the control gate part 31, is overlapped with the control active region (11 of FIG. 3) is greater than the area where the floating gate (30 of FIG. 3), i.e., the erase gate part 35, is overlapped with the erase active region (15 of FIG. 3). Therefore, the programming voltage Vp supplied to the control active region (11 of FIG. 3) may be capacitively coupled to the floating gate (30 of FIG. 3). As a result, a high electric field is formed between the erase gate part 35 and the erase active region (15 of FIG. 3). Accordingly, the electrons of the erase well 5 are subjected to F-N tunneling with respect to the erase gate part 35 and then stored in the floating gate. Here, the programming voltage Vp has a range such that F-N tunneling of the electrons of the erase active region (15 of FIG. 3) with respect to the erase gate part 35 is achieved. For example, the programming voltage Vp may be approximately 15V. Meanwhile, the control impurity region 11a facilitates the capacitive coupling.

Furthermore, the bit line 53d and the source line 53s may be floated. By doing so, the source/drain regions 13s and 13d and the read well 3 are floated. When the source/drain regions 13s and 13d and the read well 3 are floated, the data is written by F-N tunneling of the electrons between the erase gate part 35 and the erase well 5. Accordingly, the tunneling of the electrons via the gate insulating layer 20 of the read transistor Tr is not needed. Therefore, degradation of the read transistor Tr can be decreased.

In an alternative exemplary embodiment, the bit line 53d and the source line 53s may be supplied with the ground voltage. In this case, the ground voltage is supplied to the read well 3 via the read well contact region 13w, thereby forming a high electric field between the floating gate 30, i.e., the read gate part 33, and the read well 3. Therefore, the electrons of the read well 3 may be subjected to F-N tunneling with respect to the read gate part 33, and may be stored in the floating gate 30.

When the data is written as described above, the programming voltage Vp is commonly supplied to the control well 1 and the control impurity regions 11a. This common supply of the programming voltage Vp may prevent a breakdown of the junction between the control well 1 and the control impurity regions 11a. In addition, the ground voltage is commonly supplied to the erase well 5 and the erase impurity region 15a. This common supply of ground voltage may prevent a breakdown of the junction between the erase well 5 and the erase impurity region 15a. Similarly, the ground voltage is commonly supplied to the read well 3 and the source/drain regions 13s and 13d to prevent a breakdown of the junction between the read well 3 and the source/drain regions 13s and 13d.

A backward bias may be applied between the deep well 4 and the read well 3, and between the deep well 4 and the semiconductor substrate 10. However, because the wells 3 and 4 have an impurity density lower than that of the impurity regions 11a, 13s, 13d and 15a, the junction breakdown voltage between the deep well 4 and the read well 3, and between the deep well 4 and the semiconductor substrate 10 may be higher than the programming voltage Vp. Therefore, the junction breakdown may not occur when writing the data.

Figure 5B:
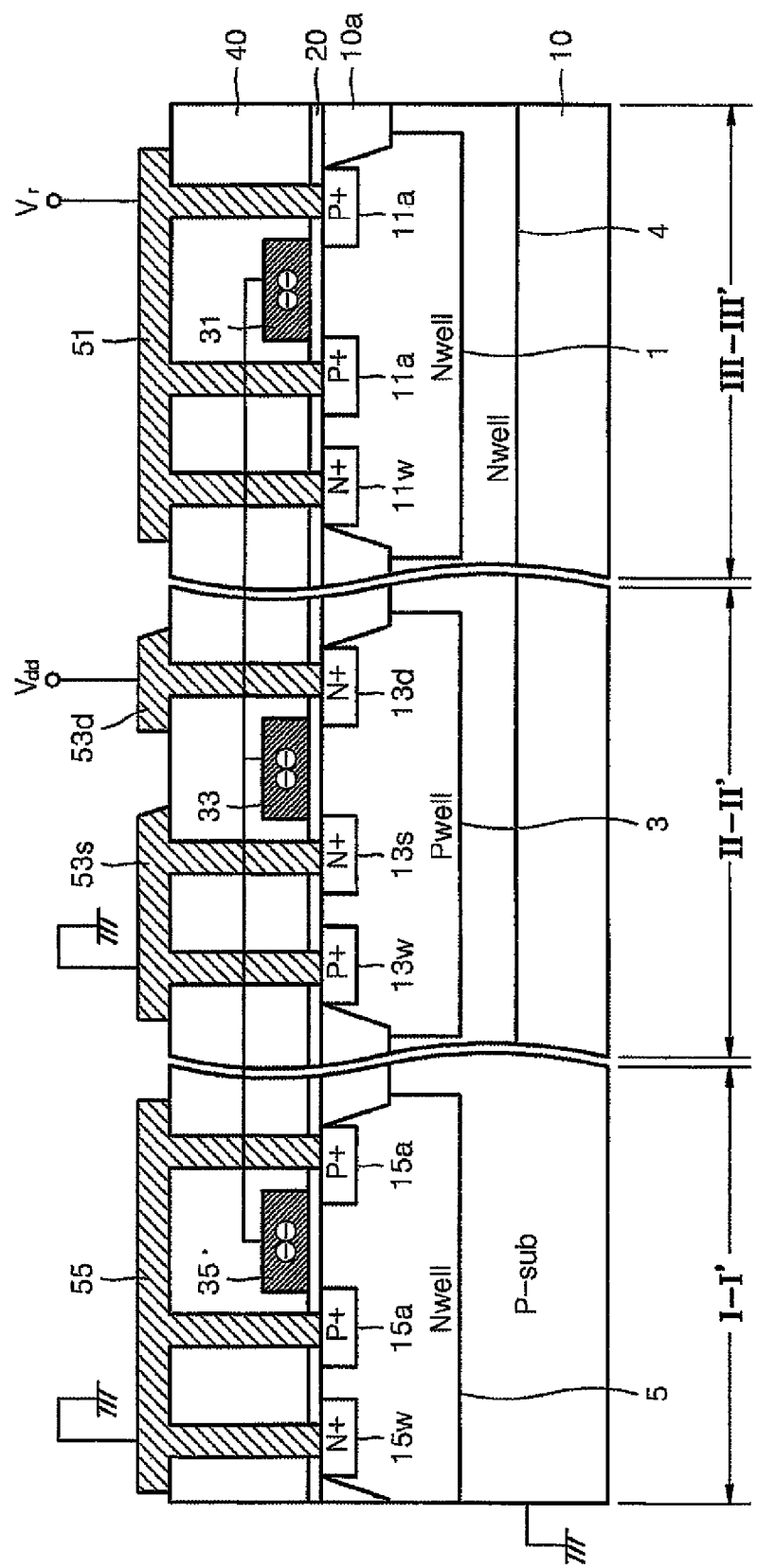
FIG. 5B illustrates reading data out of the EEPROM according to an exemplary disclosed embodiment of the present invention.

Referring to FIG. 5B, a method of reading out the data will now be described. A read voltage Vr is supplied to the control active region (11 of FIG. 3) via the word line 51. Furthermore, a power supply voltage Vdd is supplied to the drain region 13d via the bit line 53d. In addition, a ground voltage is supplied to the source region 13s and the read well 3 via the source line 53s. Also, the semiconductor substrate 10 is grounded.

More specifically, the read voltage Vr is supplied to the control well 1 via the control well contact region 11w, and supplied to the control impurity regions 11a if the control impurity regions 11a are formed. In addition, when the deep well 4 is formed to encircle the control well 1, the read voltage Vr is supplied to the deep well 4. In an exemplary embodiment, the read voltage Vr is approximately 5V, and the power supply voltage Vdd is approximately 3V.

In addition, in an exemplary embodiment, the read voltage Vr supplied to the control active region (11 of FIG. 3) is capacitively coupled to the floating gate (30 of FIG. 3). Therefore, if no electrons are stored in the floating gate 30, the voltage capacitively coupled to the floating gate 30 forms a channel in the read active region 13 under the read gate part 33. Therefore, the read transistor Tr is on. In contrast, when electrons are stored in the floating gate 30, no channel is formed in the read active region 13 under the read gate part 33. Therefore, the read transistor Tr is off. At this time, the on/off state of the read transistor Tr is monitored via the bit line 53d, thus completing the readout operation.

Furthermore, the ground voltage may be supplied to the erase active region (15 of FIG. 3) via the erase line 55. In more detail, the ground voltage supplied to the erase active region (15 of FIG. 3) is supplied to the erase well 5 via the erase well contact region 15w, and supplied to the erase impurity regions 15a if the erase impurity regions are formed.

Figure 5C:
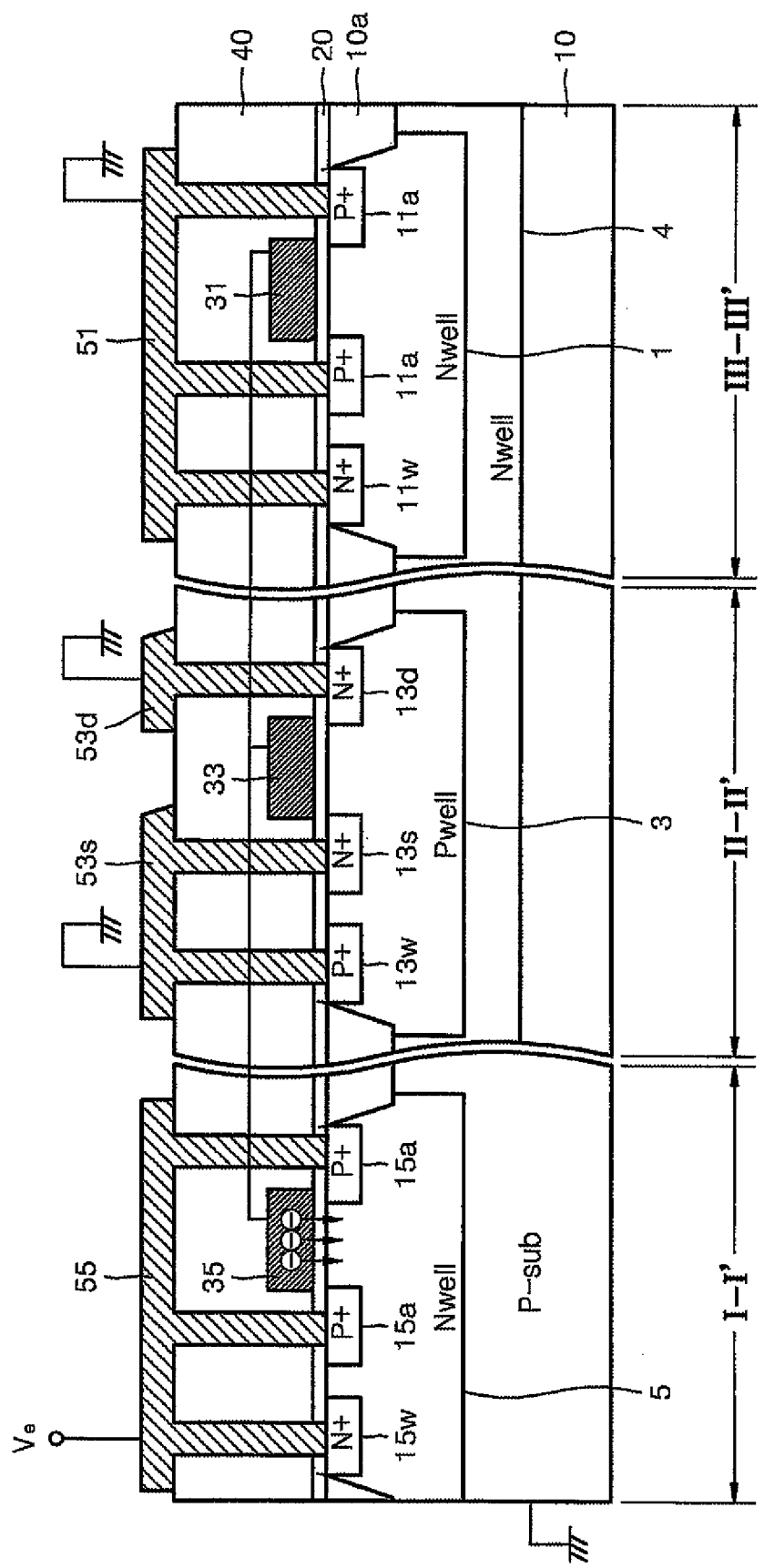
FIG. 5C illustrates erasing data from the EEPROM according to an exemplary disclosed embodiment of the present invention.

Referring to FIG. 5C, a method of erasing data will now be described. A ground voltage is supplied to the control active region (11 of FIG. 3) via the word line 51. In addition, an erase voltage Ve that is a positively high voltage is supplied to the erase active region (15 of FIG. 3) via the erase line 55. Furthermore, the semiconductor substrate 10 is grounded.

Specifically, the ground voltage supplied to the control active region (11 of FIG. 3) is supplied to the control well 1 via the control well contact region 11w, and to the control impurity regions 11a when the control impurity regions 11a are formed. In addition, if the deep well 4 is formed to encircle the control well 1, the deep well 4 is also supplied with the ground voltage. Furthermore, the erase voltage Ve is supplied to the erase well 5 via the erase well contact region 15w, and to the erase impurity regions 15a when the erase impurity regions 15a are formed.

The ground voltage supplied to the control active region (11 of FIG. 3) is capacitively coupled to the floating gate (30 of FIG. 3). As a result, a high electric field is formed between the erase gate part 35 and the erase active region (15 of FIG. 3). Therefore, the electrons of the erase gate part 35 are subjected to F-N tunneling with respect to the erase well 5, thereby eliminating charges stored in the floating gate. At this time, the erase voltage Ve has a range such that F-N tunneling of the electrons of the erase gate part 35 with respect to the erase well 5 is achieved. For example, the erase voltage Ve may be approximately 15V.

In addition, the bit line 53d and the source line 53s may be supplied with the ground voltage. By doing so, the ground voltage may be supplied to the source/drain regions 13s and 13d and the read well 3.

When the data is erased as described above, the ground voltage is commonly supplied to the control well 1 and the control impurity regions 11a. This common supply of ground voltage may prevent a breakdown of the junction between the control well 1 and the control impurity regions 11a. Furthermore, the erase voltage Ve is commonly supplied to the erase well 5 and the erase impurity region 15a. This common supply of the erase voltage may prevent a breakdown of the junction between the erase well 5 and the erase impurity region 15a. In addition, the ground voltage is also commonly supplied to the read well 3 and the source/drain regions 13s and 13d to prevent a breakdown in the junction between the read well 3 and the source/drain regions 13s and 13d.

In addition, a backward bias may be applied between the erase well 5 and the semiconductor substrate 10. However, because the erase well 5 has an impurity density lower than that of the erase impurity regions 15a, the junction breakdown voltage between the erase well 5 and the semiconductor substrate 10 may be higher than the erase voltage Ve. Therefore, the junction breakdown may not occur when erasing the data as described above.

Furthermore, because the foregoing erasing of the data is performed by F-N tunneling of the electrons between the erase gate part 35 and the erase well 5, the tunneling of the electrons through the gate insulating layer 20 of the read transistor Tr is not needed. Accordingly, the degradation of the read transistor Tr may be decreased.

The above-described EEPROM unit cell may be used in any semiconductor memory device. As described above, a read active region and an erase active region are formed as separate regions on a semiconductor substrate. Furthermore, writing and erasing of data in the disclosed unit cell is performed by tunneling of electrons between the erase active region and the erase gate part, thereby preventing degradation of a read transistor. Additionally, breakdown of all junctions included in an EEPROM unit cell can be prevented during the writing and the erasing of the data. As a result, reliability of the EEPROM can be secured.

While the disclosed EEPROM device has been particularly shown and described with reference to exemplary embodiments thereof, it will be understood by those of ordinary skill in the art that various changes in form and details may be made therein without departing from the spirit and scope of the disclosure as defined by the following claims and their equivalents.

What is claimed is:

1. A method of operating a nonvolatile memory device, the device including a semiconductor substrate including spaced apart first, second and third active regions, a common floating gate traversing over the first through third active regions, source/drain regions formed in the third active region on opposite sides of the floating gate, a first well disposed within the first active region, and first impurity regions formed in the first active region on opposite sides of the floating gate,
the method comprising erasing data, wherein the erasing data comprises:
supplying a ground voltage to the first active region; and
supplying an erase voltage to the second active region.

2. The method of claim 1, wherein the supplying the ground voltage to the first active region comprises supplying the ground voltage to the first well and the first impurity regions.

3. The method of claim 1, wherein the device further includes a second well disposed within the second active region, and second impurity regions formed in the second active region on opposite sides of the floating gate, wherein the supplying the erase voltage to the second active region comprises supplying the erase voltage to the second well and the second impurity regions.

4. The method of claim 1, wherein the erasing data further comprises supplying the ground voltage to the source/drain regions.

5. The method of claim 4, wherein the device further includes a third well disposed within the third active region, and encircling the source/drain regions, wherein the erasing data further comprises supplying the ground voltage to the third well.

6. The method of claim 1, wherein the device is an electrically erasable and programmable read-only memory (EEPROM), and the first, second and third active include a control MOS capacitor, an erase MOS capacitor and a read transistor, respectively.

7. The method of claim 1, wherein the erase voltage causes electrons of the floating gate to undergo Fowler-Nordheim tunneling into the second active region.

8. The method of claim 1, further comprising writing data, wherein the writing data comprises:

supplying a programming voltage to the first active region; and supplying a ground voltage to the second active region.

9. The method of claim 8, wherein supplying the programming voltage to the first active region comprises supplying the programming voltage to the first well and the first impurity regions.

10. The method of claim 8, wherein the device further includes a second well disposed within the second active region, and second impurity regions formed in the second active region on opposite sides of the floating gate, wherein the supplying the ground voltage to the second active region comprises supplying the ground voltage to the second well and the second impurity regions.

11. The method of claim 8, wherein the source/drain regions are in a floating voltage state.

12. The method of claim 8, wherein the device further includes a third well disposed within the third active region, and encircling the source/drain regions, wherein the writing data further comprises supplying the ground voltage to the third well.

13. The method of claim 1, further comprising reading out data, wherein the reading out data comprises:

supplying a read voltage to the first active region;

supplying a power supply voltage to the drain region; and supplying a ground voltage to the source region.

14. The method of claim 13, wherein the supplying the read voltage to the first active region comprises supplying the read voltage to the first well and the first impurity regions.

15. The method of claim 13, further comprising the supplying a ground voltage to the second active region.

16. The method of claim 15, wherein the device further includes a second well disposed within the second active region, and second impurity regions formed in the second active region on opposite sides of the floating gate, wherein the supplying the ground voltage to the second active region comprises supplying the ground voltage to the second well and the second impurity regions.

17. The method of claim 13, wherein the device further includes a third well disposed within the semiconductor substrate of the third active region, and encircling the source/drain regions, wherein the reading out data further comprises supplying a ground voltage to the third well.

18. A method of operating a nonvolatile memory device, the device including a semiconductor substrate including spaced apart first, second and third active regions, a common floating gate traversing over the first through third active regions, source/drain regions formed in the third active region on opposite sides of the floating gate, a first well disposed within the first active region, and first impurity regions formed in the first active region on opposite sides of the floating gate, the method comprising:

supplying a first voltage to the first active region; and supplying a second voltage to the second active region.

19. The method of claim 18, wherein the first voltage is any one of a ground voltage, a programming voltage, and read voltage.

20. The method of claim 18, wherein the second voltage is any one of an erase voltage, and a ground voltage.

* * * * *